United States Patent
Lin et al.

(10) Patent No.: US 10,833,064 B2
(45) Date of Patent: Nov. 10, 2020

(54) ESD PROTECTION CIRCUIT AND INTEGRATED CIRCUIT FOR BROADBAND CIRCUIT

(71) Applicant: National Taiwan Normal University, Taipei (TW)

(72) Inventors: Chun-Yu Lin, Hsinchu (TW); Yu-Hsuan Lai, Taipei (TW)

(73) Assignee: National Taiwan Normal University, Taipei (TW)

( * ) Notice: Subject to any disclaimer, the term of this patent is extended or adjusted under 35 U.S.C. 154(b) by 323 days.

(21) Appl. No.: 15/934,079

(22) Filed: Mar. 23, 2018

(65) Prior Publication Data
US 2019/0214380 A1    Jul. 11, 2019

(30) Foreign Application Priority Data
Jan. 5, 2018   (TW) .............. 107100554 A

(51) Int. Cl.
H01L 27/02    (2006.01)
H01L 29/74    (2006.01)

(52) U.S. Cl.
CPC ...... *H01L 27/0262* (2013.01); *H01L 27/0255* (2013.01); *H01L 27/0288* (2013.01); *H01L 29/7412* (2013.01)

(58) Field of Classification Search
CPC .......... H01L 27/0262; H01L 27/0288; H01L 27/0255; H01L 29/7412
(Continued)

(56) References Cited

U.S. PATENT DOCUMENTS 6,989,572 B2    1/2006  Stefanov et al.
8,952,456 B2    2/2015  Ker et al.
(Continued)

FOREIGN PATENT DOCUMENTS

TW    I339433 B    3/2011
TW    I549258 B    9/2016

OTHER PUBLICATIONS

C. Y. Lin et al., "ESD protection structure with inductor-triggered SCR for RF applications in 65-nm CMOS process," *2012 IEEE International Reliability Physics Symposium (IRPS)*, Anaheim, CA, 2012, pp. EL.3.1-EL.3.5.
(Continued)

*Primary Examiner* — Dharti H Patel
(74) *Attorney, Agent, or Firm* — Muncy, Geissler, Olds & Lowe, P.C.

(57) ABSTRACT

An ESD protection circuit and integrated circuit for a broadband circuit are disclosed. The ESD protection circuit includes a silicon-controlled rectifier, an inductor and a trigger unit. The silicon-controlled rectifier is formed by four semiconductor materials and includes a first end, a second end and a third end. The first end is coupled with a first P-type semiconductor material and a signal input end. The second end is coupled with a second N-type semiconductor material. The third end is coupled with a second P-type semiconductor material. One end of the inductor is coupled with the signal input end and the first end, and the other end thereof is coupled with a signal output end and a high-frequency circuit. One end of the trigger unit is coupled with the signal output end and the high-frequency circuit, and the other end thereof is coupled with the third end.

7 Claims, 6 Drawing Sheets

(58) Field of Classification Search
USPC .......................................................... 361/56
See application file for complete search history.

(56) References Cited

U.S. PATENT DOCUMENTS

| | | | |
|---|---|---|---|
| 9,379,099 B2 | 6/2016 | Lin | |
| 2011/0227127 A1* | 9/2011 | Ohta | ................... H01L 27/0262 |
| | | | 257/133 |
| 2014/0307355 A1* | 10/2014 | Tsai | ................... H01L 27/0248 |
| | | | 361/56 |
| 2015/0325569 A1* | 11/2015 | Lin | .................... H01L 27/0248 |
| | | | 361/56 |

OTHER PUBLICATIONS

M. P. J. Mergens et al., "Speed optimized diode-triggered SCR (DTSCR) for RF ESD protection of ultra-sensitive IC nodes in advanced technologies," in *IEEE Transactions on Device and Materials Reliability*, vol. 5, No. 3, Sep. 2005, pp. 532-542.

C. Y. Lin and R. K. Chang, "Test structures of LASCR device for RF ESD protection in nanoscale CMOS process," 2016 International Conference on Microelectronic Test Structures (ICMTS), Yokohama, 2016, pp. 100-103.

* cited by examiner

ESD PROTECTION CIRCUIT AND INTEGRATED CIRCUIT FOR BROADBAND CIRCUIT

CROSS REFERENCE TO RELATED APPLICATIONS

This Non-provisional application claims priority under 35 U.S.C. § 119(a) on Patent Application No(s). 107100554 filed in Taiwan, Republic of China on Jan. 5, 2018, the entire contents of which are hereby incorporated by reference.

BACKGROUND

Technology Field

The present disclosure relates to an ESD protection circuit and an integrated circuit. In particular, the present disclosure relates to an ESD protection circuit and an integrated circuit that can be applied to the broadband circuit.

Description of Related Art

In recent years, the rapid development of integrated circuits, which is from the previous micron process technology to the current 10-nanometer process technology, introduces the issue of reliability of integrated circuit chips. Generally, electrostatic discharge (ESD) is the main reason causing electrical overstress (EOS) damage of electrical components. The damage caused by ESD is mostly irreversible damage, so it is imperative to design appropriate protection elements and circuits for ESD problems.

In practice, the ESD protection is usually implemented by a protection circuit, which is composed of diodes, transistors, and silicon-controlled rectifiers. When the circuit is operated in a high speed or a high frequency, the parasitic capacitance of the protection circuit can influence the impedance matching and signal transmission of the original circuit. Thus, the influence to the original circuit caused by the ESD protection circuit must be further considered in the component design.

The silicon-controlled rectifier has higher ESD tolerance in unit area than the diode or other protection units. However, the semiconductor structure in the silicon-controlled rectifier has parasitic capacitance, so that the proper design is needed for preventing the damage of the internal circuit caused by the protection unit. Expect the issue of parasitic effect, the trigger speed of the silicon-controlled rectifier is not enough, so that the additional trigger device is needed. However, the additional trigger device will increase the parasitic capacitance value, generate loss or distortion of the inputted signal, and decrease the utility of the protection unit. In addition, although the additional trigger device can trigger the silicon-controlled rectifier and improve the trigger speed, it will also increase the parasitic capacitance. This will cause a worse parasitic effect and is not suitable for the high-frequency circuit.

SUMMARY

An objective of this disclosure is to provide an ESD protection circuit and an integrated circuit applied to the broadband circuit. The disclosed ESD protection circuit and an integrated circuit have a good ESD protection ability, are capable of improve the issue of insufficient trigger speed, and reduce the loss and reflection of the passed signals, so that the internal circuits of the integrated circuit can operate in a wider bandwidth.

To achieve the above objective, the present disclosure provides an ESD protection circuit for a broadband circuit. The ESD protection circuit is cooperated with a high-frequency circuit and includes a signal input end and a signal output end, and the high-frequency circuit is electrically coupled with the signal output end. The ESD protection circuit includes a silicon-controlled rectifier, an inductor and a trigger unit. The silicon-controlled rectifier is formed by a first P-type semiconductor material, a first N-type semiconductor material, a second P-type semiconductor material, and a second N-type semiconductor material, which are connected sequentially. The silicon-controlled rectifier includes a first end, a second end and a third end. The first end is electrically coupled with the first P-type semiconductor material and the signal input end, the second end is electrically coupled with the second N-type semiconductor material, and the third end is electrically coupled with the second P-type semiconductor material. One end of the inductor is electrically coupled with the signal input end and the first end, and the other end of the inductor is electrically coupled with the signal output end and the high-frequency circuit. One end of the trigger unit is electrically coupled with the signal output end and the high-frequency circuit, and the other end of the trigger unit is electrically coupled with the third end of the silicon-controlled rectifier.

To achieve the above objective, the present disclosure also provides an integrated circuit for a broadband circuit. The integrated circuit includes a high-frequency circuit and an ESD protection circuit. The ESD protection circuit includes a signal input end and a signal output end, and the high-frequency circuit is electrically coupled with the signal output end. The ESD protection circuit further includes a silicon-controlled rectifier, an inductor and a trigger unit. The silicon-controlled rectifier is formed by a first P-type semiconductor material, a first N-type semiconductor material, a second P-type semiconductor material, and a second N-type semiconductor material, which are connected sequentially. The silicon-controlled rectifier includes a first end, a second end and a third end. The first end is electrically coupled with the first P-type semiconductor material and the signal input end, the second end is electrically coupled with the second N-type semiconductor material, and the third end is electrically coupled with the second P-type semiconductor material. One end of the inductor is electrically coupled with the signal input end and the first end, and the other end of the inductor is electrically coupled with the signal output end and the high-frequency circuit. One end of the trigger unit is electrically coupled with the signal output end and the high-frequency circuit, and the other end of the trigger unit is electrically coupled with the third end of the silicon-controlled rectifier.

In one embodiment, the ESD protection circuit has a resonance frequency, the high-frequency circuit has an operation frequency, the operation frequency includes an operation frequency range, and the resonance frequency is located within the operation frequency range.

In one embodiment, an inductance value L of the inductor satisfies an equation as follow:

$$L = \frac{2Z_0 C}{1 + 2\pi \cdot f_0 Z_0 C^2}$$

wherein, $f_0$ is the resonance frequency, $Z_0$ is a matching impedance of the high-frequency circuit, $C_1$ is a parasitic capacitance value between the first P-type semiconductor material and the second P-type semiconductor material, $C_3$ is a parasitic capacitance value of the trigger unit, and $C=C_1=C_3$.

In one embodiment, an equivalent circuit of the silicon-controlled rectifier includes two transistors, and one electrode of one of the transistors is electrically coupled with a voltage source.

In one embodiment, the trigger unit includes a plurality of diodes connected in series, a plurality of Zener diodes connected in series, or a transistor.

As mentioned above, in the ESD protection circuit and integrated circuit for a broadband circuit of this disclosure, the silicon-controlled rectifier is formed by four kinds of semiconductor materials, which are connected sequentially. One end of the inductor is electrically coupled with the signal input end of the ESD protection circuit and the first end of the silicon-controlled rectifier, and the other end of the inductor is electrically coupled with the signal output end of the ESD protection circuit and the high-frequency circuit. One end of the trigger unit is electrically coupled with the signal output end and the high-frequency circuit, and the other end of the trigger unit is electrically coupled with the third end of the silicon-controlled rectifier. Based on the above structural design, the ESD protection circuit and integrated circuit of this disclosure have a good ESD protection ability, are capable of improve the issue of insufficient trigger speed, and reduce the loss and reflection of the passed signals, so that the internal circuits of the integrated circuit can operate in a wider bandwidth.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

An integrated circuit for a broadband circuit includes a high-frequency circuit and an ESD protection circuit, and the ESD protection circuit is electrically coupled with the high-frequency circuit. The technical contents and relative configuration of the high-frequency circuit and the ESD protection circuit will be described hereinafter with reference to the related drawings.

Figure 1:
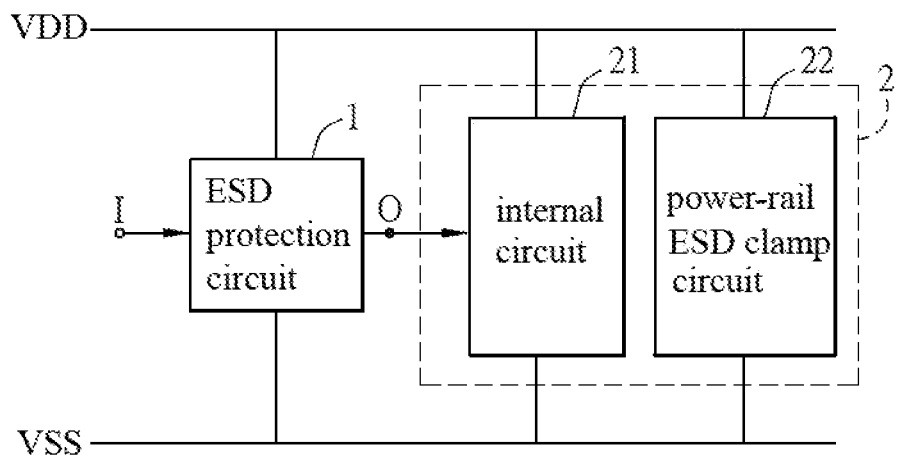
FIG. 1 is a schematic diagram showing an integrated circuit, which includes an ESD protection circuit cooperating with a high-frequency circuit, applied to a broadband circuit according to an embodiment of the disclosure.

FIG. 1 is a schematic diagram showing an integrated circuit, which includes an ESD protection circuit 1 cooperating with a high-frequency circuit 2, applied to a broadband circuit according to an embodiment of the disclosure.

The integrated circuit includes an ESD protection circuit 1 and a high-frequency circuit 2, which are electrically coupled with each other. The ESD protection circuit 1 and the high-frequency circuit 2 are electrically coupled between a first voltage VDD and a second voltage VSS. In this embodiment, the ESD protection circuit 1 is functioned as an ESD protection device of the high-frequency circuit 2 for preventing the damage of the high-frequency circuit 2 caused by electrostatic discharge. For example, the first voltage VDD is a positive voltage, the second voltage VSS is 0 volt (grounded), and voltage difference between the first voltage VDD and the second voltage VSS is equal to the operation voltage of the high-frequency circuit 2. In this embodiment, the high-frequency circuit 2 includes an internal circuit 21 and a power-rail ESD clamp circuit 22. The internal circuit 21 and the power-rail ESD clamp circuit 22 are electrically connected in parallel, so that the ESD protection circuit 1 and the power-rail ESD clamp circuit 22 can implement the fully ESD protection design of the internal circuit 21. Thus, the integrated circuit can be applied to a wider bandwidth.

The ESD protection circuit 1 includes a signal input end I and a signal output end O. The high-frequency circuit 2 is electrically coupled with the signal output end O for receiving the signal inputted from the signal input end I (e.g. an RF signal). In this embodiment, the high-frequency circuit 2 includes an input end (not shown) coupled with the signal output end O of the ESD protection circuit 1. In practice, the input ends of the high-frequency circuit 2 can be electrically coupled with the signal output ends O of multiple ESD protection circuits 1, respectively, for providing a fully ESD protection.

Figure 2A:
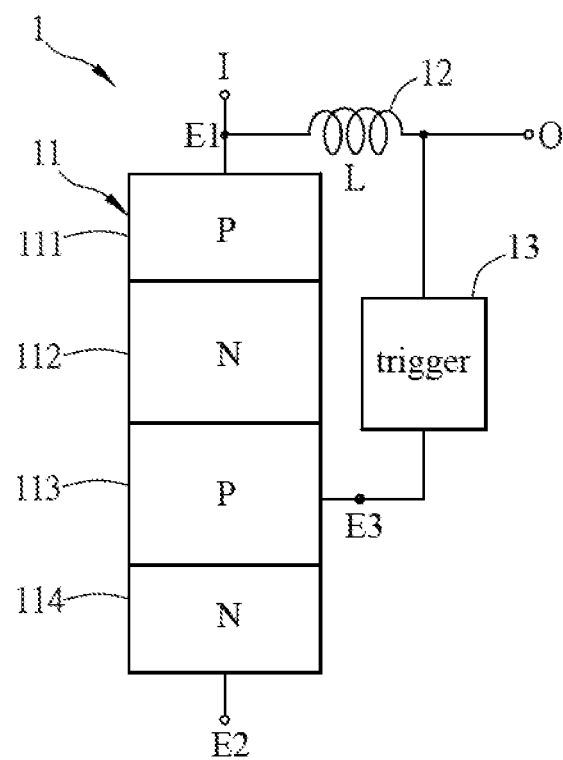
FIG. 2A is a schematic diagram showing an ESD protection circuit according to an embodiment of the disclosure.
Figure 2B:
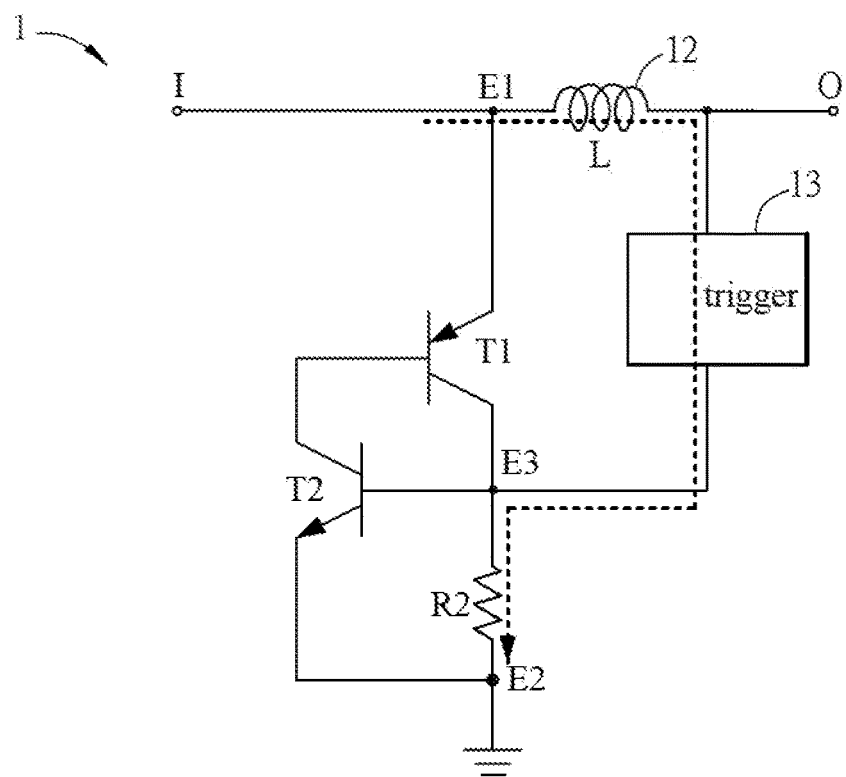
FIG. 2B is a schematic diagram showing an equivalent circuit of the ESD protection circuit of FIG. 2A.
Figure 2C:
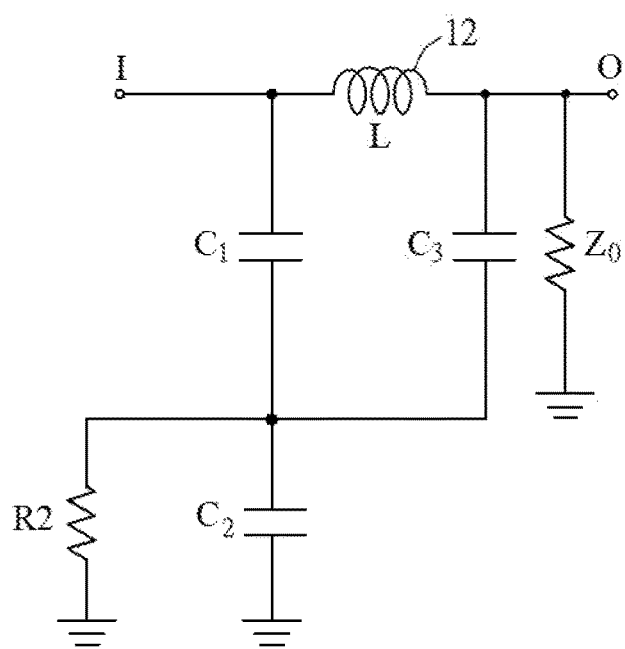
FIG. 2C is a schematic diagram showing a simplified equivalent circuit of the ESD protection circuit of FIG. 2B.

FIG. 2A is a schematic diagram showing the ESD protection circuit 1 according to an embodiment of the disclosure, FIG. 2B is a schematic diagram showing an equivalent circuit of the ESD protection circuit 1 of FIG. 2A, and FIG. 2C is a schematic diagram showing a simplified equivalent circuit of the ESD protection circuit 1 of FIG. 2B.

As shown in FIG. 2A, the ESD protection circuit 1 includes a silicon-controlled rectifier (SCR) 11, an inductor 12, and a trigger unit 13. The inductor 12 has an induction value L.

The silicon-controlled rectifier 11 is formed by a first P-type semiconductor material 111, a first N-type semiconductor material 112, a second P-type semiconductor material 113, and a second N-type semiconductor material 114, which are connected sequentially. The technical contents of the P-type semiconductor material and N-type semiconductor material are well known to the skilled persons, so the detailed descriptions thereof will be omitted.

The silicon-controlled rectifier 11 is a thyristor device including a first end E1, a second end E2, and a third end E3. The first end E1 is the anode of the silicon-controlled rectifier 11, the second end E2 is the cathode of the silicon-controlled rectifier 11, and the third end E3 is the trigger end of the silicon-controlled rectifier 11. The first end E1 is electrically coupled with the first P-type semiconductor material 111 and the signal input end I, the second end E2 is electrically coupled with the second N-type semiconductor material 114 and the second voltage VSS, and the third end E3 is electrically coupled with the second P-type semiconductor material 113.

One end of the inductor 12 is electrically coupled with the signal input end I and the first end E1 of the silicon-controlled rectifier 11, and the other end of the inductor 12 is electrically coupled with the signal output end O, one end of the trigger unit 13, and the internal circuit 21 (see FIG. 1).

The silicon-controlled rectifier 11 is a four-layer semiconductor structure, which may cause the latchup issue, but it has a good performance in ESD protection ability. Thus, the silicon-controlled rectifier 11 can provide a high ESD tolerance in a small layout area. Since the operating voltage of the integrated circuit is decreasing as the manufacturing processes are improved, the risk of inducing the latchup issue by the silicon-controlled rectifier 11 is gradually decreased. Accordingly, this embodiment utilizes the silicon-controlled rectifier 11 as the ESD protection device of the high-frequency circuit 2. Nevertheless, in order to decrease the parasitic effect of the silicon-controlled rectifier 11, one end of the inductor 12 is coupled with the signal input end I and the first end E1 of the silicon-controlled rectifier 11, and the other end of the inductor 12 is coupled with the signal output end O, one end of the trigger unit 13 and the internal circuit 21 of the high-frequency circuit 2, thereby decreasing the parasitic capacitance value of the ESD protection circuit 1.

As shown in FIG. 2B, the equivalent circuit of the silicon-controlled rectifier 11 includes a transistor T1 and a transistor T2. In this embodiment, the transistor T1 is a PNP bipolar transistor (BJT), and the transistor T2 is an NPN bipolar transistor. The emitter of the transistor T1 is coupled with the first end E1 (the first end E1 is coupled with the signal input end I) and one end of the inductor 12. The base of the transistor T1 is coupled with the collector of the transistor T2. The collector of the transistor T1 is coupled with the base of the transistor T2 and the third end E3, and is further coupled with the second end E2, the emitter of the transistor T2, and the second voltage VSS through a resistor R2 (the parasitic resistance of the transistor T2).

One end of the trigger unit 13 is electrically coupled with the signal output end O, the other end of the inductor 12, and the internal circuit 21, and the other end of the trigger unit 13 is electrically coupled with the third end E3 of the silicon-controlled rectifier 11. In this embodiment, the trigger unit 13 is electrically connected between the other end of the inductor 12 (the signal output end O) and the base of the transistor T2 (and the collector of the transistor T1). The conventional silicon-controlled rectifier has a problem of high trigger voltage, so that the conventional silicon-controlled rectifier is usually cooperated with a trigger device for providing the ESD protection function of the integrated circuit. However, the additional trigger device will increase the parasitic capacitance. When the operating frequency increases, the increased parasitic capacitance will influence the signal and increase the loss, which may cause the distortion of the RF signal inputted to the internal circuit 21. In this embodiment, one end of the inductor 12 is coupled with the signal input end I, the other end thereof is coupled to the trigger unit 13, and this structure is also used in impedance matching. This configuration can improve the issue of insufficient trigger speed, decrease the parasitic effect by LC oscillation, and reduce the loss and reflection of the RF signal, which passes through the ESD protection circuit 1.

In this embodiment, the inductor 12 is disposed on the signal path (between the signal input end I and the signal output end O). One end of the inductor 12 is connected to the silicon-controlled rectifier 11, and the other end thereof is connected to the trigger unit 13. The equivalent circuit thereof is shown in FIG. 2C. In this case, $C_1$ is a parasitic capacitance value between the first P-type semiconductor material 111 and the second P-type semiconductor material 113 (also the parasitic capacitance between the emitter and collector of the transistor T1). $C_2$ is a parasitic capacitance value between the second P-type semiconductor material 113 and the second N-type semiconductor material 114 (also the parasitic capacitance between the base and emitter of the transistor T2). Besides, R2 is the parasitic resistance, $C_3$ is a parasitic capacitance value of the trigger unit 13, and $Z_0$ is a matching impedance of the high-frequency circuit 2.

In some embodiments, the designer usually selects proper silicon-controlled rectifier 11 (with enough capacity or size), parasitic capacitance values $C_1$ and $C_2$, parasitic resistance R2, and parasitic capacitance values $C_1$ of the trigger unit 13 according to the required ESD tolerance ability. In this embodiment, the proper inductor 12 can be selected based on the following equation:

$$L = \frac{2Z_0 C}{1 + 2\pi \cdot f_0 Z_0 C^2}$$

In order to simplify the calculation, it is assumed that $C=C_1=C_3$, the value of R2 is very small, and the common connecting end of R2 and $C_2$ is grounded, thereby obtaining the above equation. However, in other embodiments, if $C_1$ is not equal to $C_3$, the inductance value L of the inductor 12 cannot satisfy the above equation, and the proper equation must be recalculated and modified. In addition, the ESD protection circuit 1 further has a resonance frequency $f_0$, and the high-frequency circuit 2 has an operation frequency. The operation frequency includes an operation frequency range, and the resonance frequency $f_0$ is located within the operation frequency range of the high-frequency circuit 2. Accordingly, the design of the ESD protection circuit 1 for the high-frequency circuit 2 is finished.

Figure 3A:
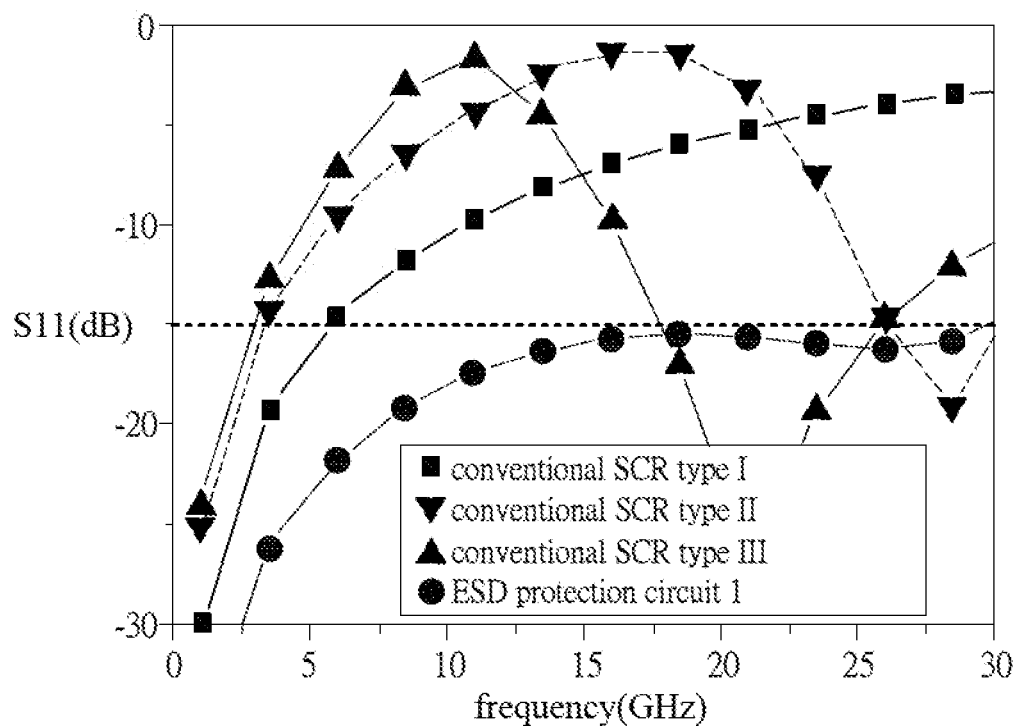
FIG. 3A is a schematic diagram showing the results (parameter S11) of the ESD protection circuit according to one embodiment of the disclosure and the conventional silicon-controlled rectifiers (three types)
Figure 3B:
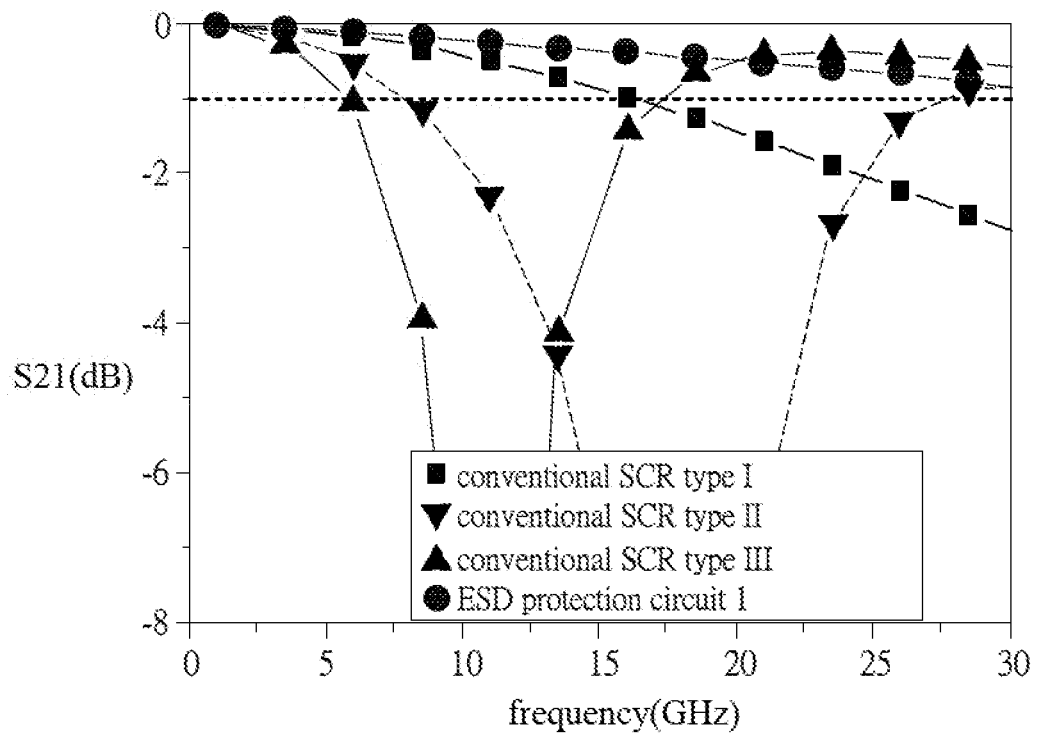
FIG. 3B is a schematic diagram showing the results (parameter S21) of the ESD protection circuit according to one embodiment of the disclosure and the conventional silicon-controlled rectifiers (three types)

FIG. 3A is a schematic diagram showing the results (parameter S11) of the ESD protection circuit 1 according to one embodiment of the disclosure and the conventional silicon-controlled rectifiers (three types), and FIG. 3B is a schematic diagram showing the results (parameter S21) of the ESD protection circuit 1 according to one embodiment of the disclosure and the conventional silicon-controlled rectifiers (three types).

In the conventional art, the inductor and the parasitic capacitance of the transistor in the silicon-controlled rectifier can generate resonance to reduce the parasitic effect. However, the impedance at the oscillation frequency point will be infinite. In the conventional solution by utilizing the inductor and silicon-controlled rectifier, the structure includes an inductor and a capacitance connected in parallel, which are then connected to a capacitance in series. As shown in FIGS. 3A and 3B, in the oscillation frequency, the parameter S11 of the conventional art becomes negative infinite, and the parameter S21 becomes 0. Accordingly, it will have a band-pass or band-rejection quality.

In this embodiment, the inductor 12 of the ESD protection circuit 1 is located on the signal path (between the signal input end I and the internal circuit 21). One end of the inductor 12 close to the signal input end I is connected to the silicon-controlled rectifier 11, and the other end of the inductor 12 close to the signal output end O (and the internal circuit 12) is connected to the trigger unit 13. Thus, the inductor 12 and the parasitic capacitance between the silicon-controlled rectifier 11 and the trigger unit 13 can generate resonance, which can reduce the influence of the signal caused by the parasitic capacitance. In the effective bandwidth, the inputted RF signal can remain the original characteristics, so that the internal circuit 21 can be operated in a wider bandwidth.

Referring to FIG. 2B, when the electrostatic voltage is discharged from the signal input end I to the second voltage VSS, the electrostatic current generated by the electrostatic voltage can flow to the third end E3 of the silicon-controlled rectifier 11 through the inductor 12 and the trigger unit 13, and then flow to the second voltage VSS through the internal resistance R2 of the silicon-controlled rectifier 11, thereby triggering the silicon-controlled rectifier 11. Thus, the electrostatic current will not flow through the internal circuit 21 so as to prevent the damage of the high-frequency circuit 2 caused by the electrostatic current. In this embodiment, the trigger unit 13 is configured to lower the conducting voltage, so that the electrostatic current can flow to the third end E3 of the silicon-controlled rectifier 11 through the trigger unit 13. Then, the cross voltage between the base and emitter of the transistor T2 in the silicon-controlled rectifier 11 is boosted to conduct the silicon-controlled rectifier 11. Accordingly, the electrostatic current can be rapidly conducted and released to the second voltage VSS, thereby preventing the damage of the internal circuit 21.

Figure 4A:
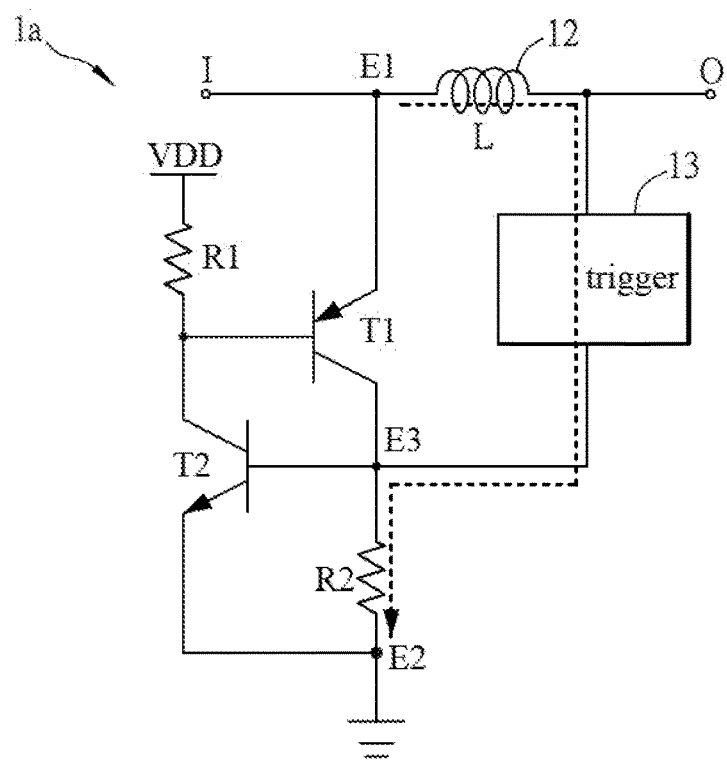
FIG. 4A is a schematic diagram showing an equivalent circuit of the ESD protection circuit according to another embodiment of this disclosure.

FIG. 4A is a schematic diagram showing an equivalent circuit of an ESD protection circuit 1a according to another embodiment of this disclosure.

Different from the ESD protection circuit 1 of FIG. 2B, in the ESD protection circuit 1a of FIG. 4A, the base of the transistor T1 (and the collector of the transistor T2) is electrically coupled to a power source (the first voltage VDD) via a resistance R1. Accordingly, a parasitic diode can be formed inside the silicon-controlled rectifier 11. This can add the discharging path from the signal input end I to the voltage source (the first voltage VDD).

In addition, the user can optionally select the required components to form the trigger unit 13 for protecting the internal circuit 21. In some embodiments, the trigger unit 13 includes, for example, a plurality of diodes connected in series, a plurality of Zener diodes connected in series, or a transistor (for example but not limited to an NMOS transistor or a PMOS transistor). Some aspects of the ESD protection circuits will be described hereinafter with reference to FIGS. 4B to 4F, which are schematic diagrams showing different aspects of the ESD protection circuits of this disclosure.

Figure 4B:
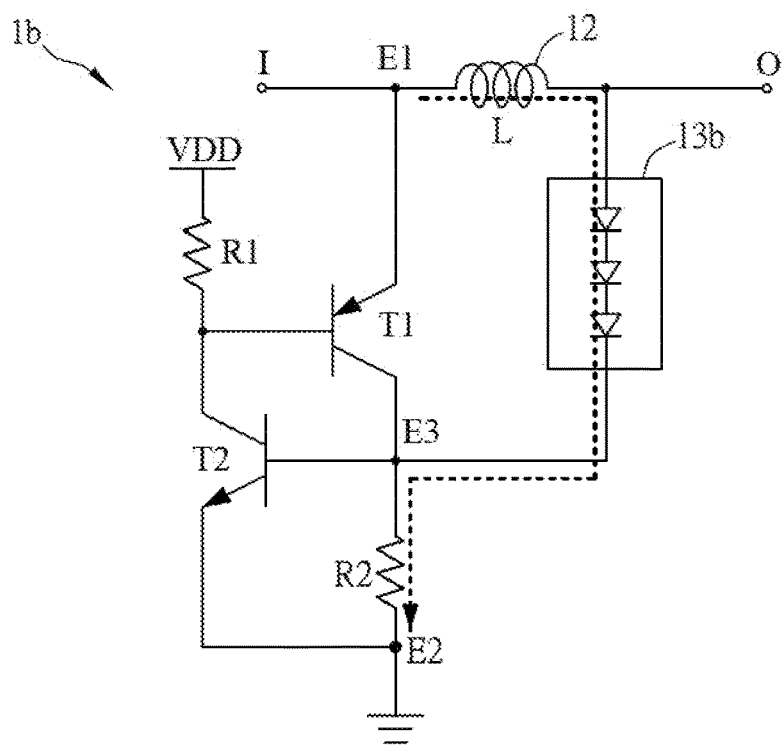
FIGS. 4B to 4F are schematic diagrams showing different aspects of the ESD protection circuits of this disclosure.
Figure 4C:
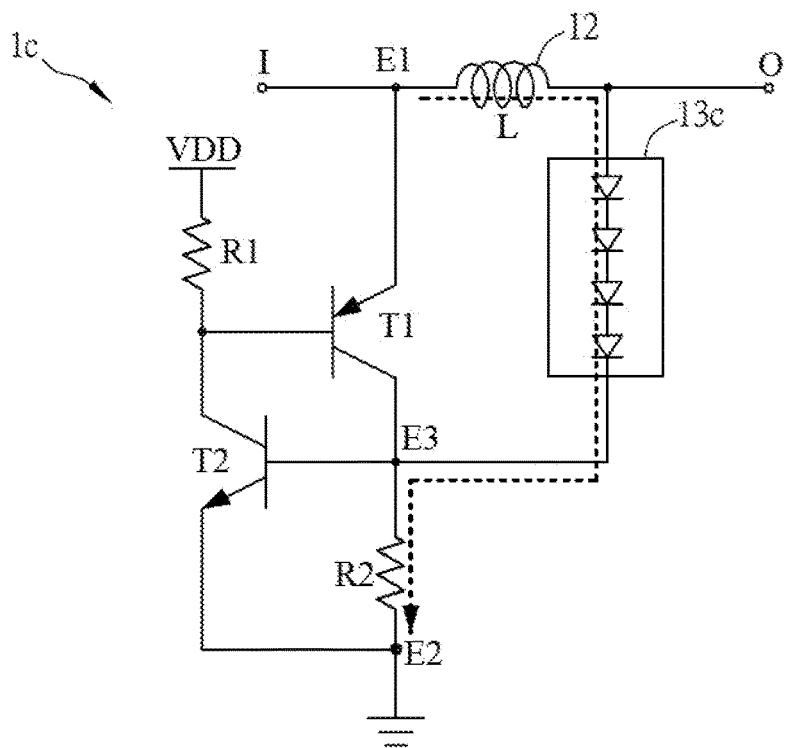
Figure 4D:
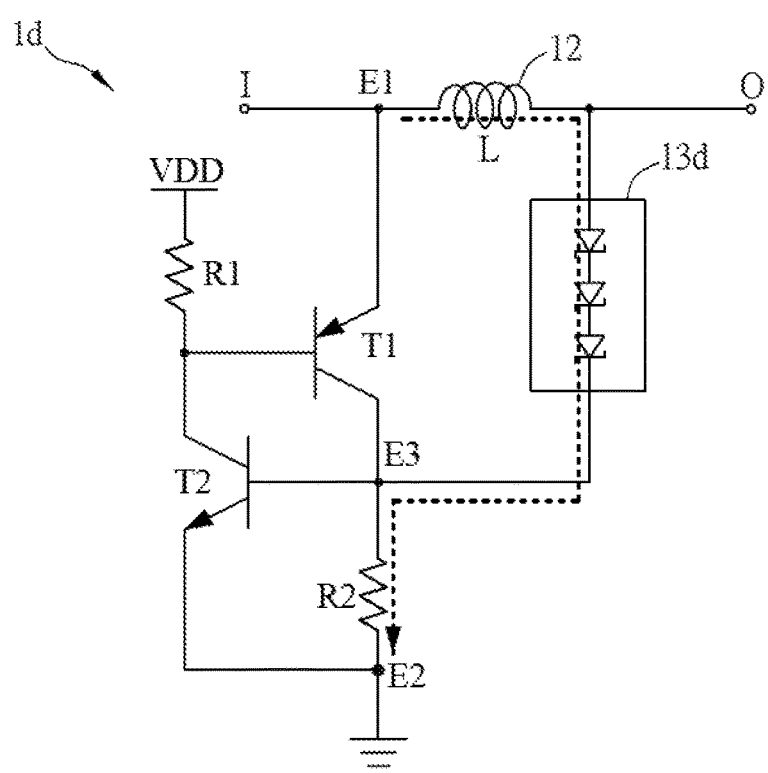
Figure 4E:
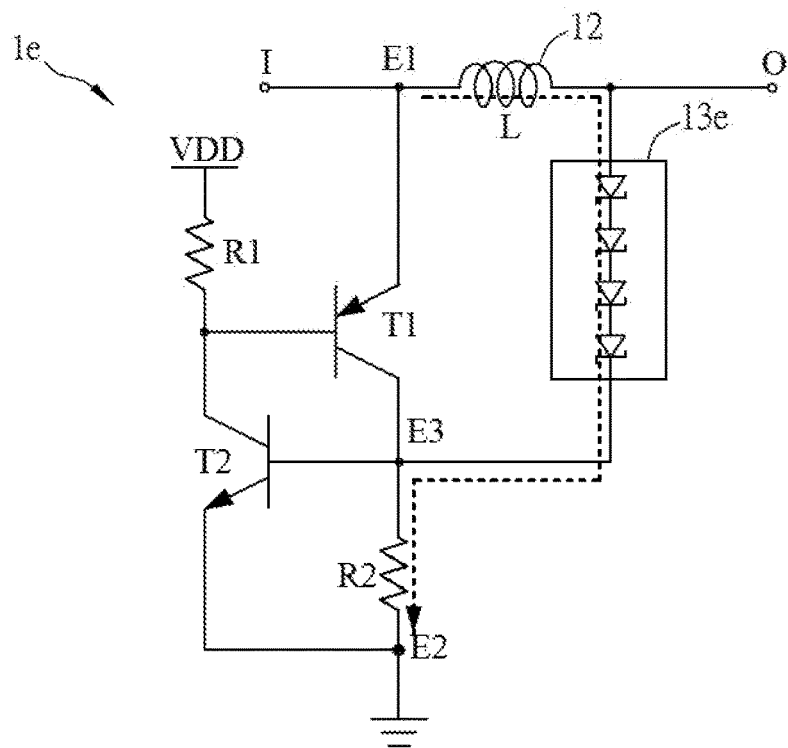

As shown in FIG. 4B, the trigger unit 13b of the ESD protection circuit 1b includes three diodes connected in series. As shown in FIG. 4C, the trigger unit 13c of the ESD protection circuit 1c includes four diodes connected in series. As shown in FIG. 4D, the trigger unit 13d of the ESD protection circuit 1d includes three Zener diodes, which have a clamping function in reverse bias, connected in series. As shown in FIG. 4E, the trigger unit 13e of the ESD protection circuit 1e includes four Zener diodes, which have a clamping function in reverse bias, connected in series.

To be noted, since the electrostatic discharging path is generated by conducting the silicon-controlled rectifier 11, the size of the components of the ESD protection circuit must be large enough for effectively discharging the electrostatic current and preventing the damage of the internal circuit 21. Besides, the trigger unit is used to provide a small trigger current, so the size thereof can be smaller. Accordingly, the ESD tolerance of the disclosure can be determined by the size (voltage and current tolerances) of the silicon-controlled rectifier 11. In addition, the inductor 12 located on the signal path can be cooperated with the silicon-controlled rectifier 11 and the trigger unit 13 to generate LC resonance for decreasing the weakness of the signal caused by the parasitic capacitance. Moreover, when encountering the ESD bombarding, the voltage of the signal input end I will immediately boost, so the voltage of the signal output end O will also boost through the inductor 12. Since the serially connected diodes (including the Zener diodes) of the trigger units 13b~13e have smaller conducting voltage, so the trigger units 13b~13e will be conducted earlier than the silicon-controlled rectifier 11. Thus, the generated trigger current can flow to the third end E3 of the silicon-controlled rectifier 11 through the inductor 12 and the trigger units 13b~13e, thereby increasing the cross voltage between the base and emitter of the transistor T2. This can completely conduct the internal parasitic transistors T1 and T2 for rapidly discharging the electrostatic current and preventing the damage of the internal circuit 21.

Figure 4F:
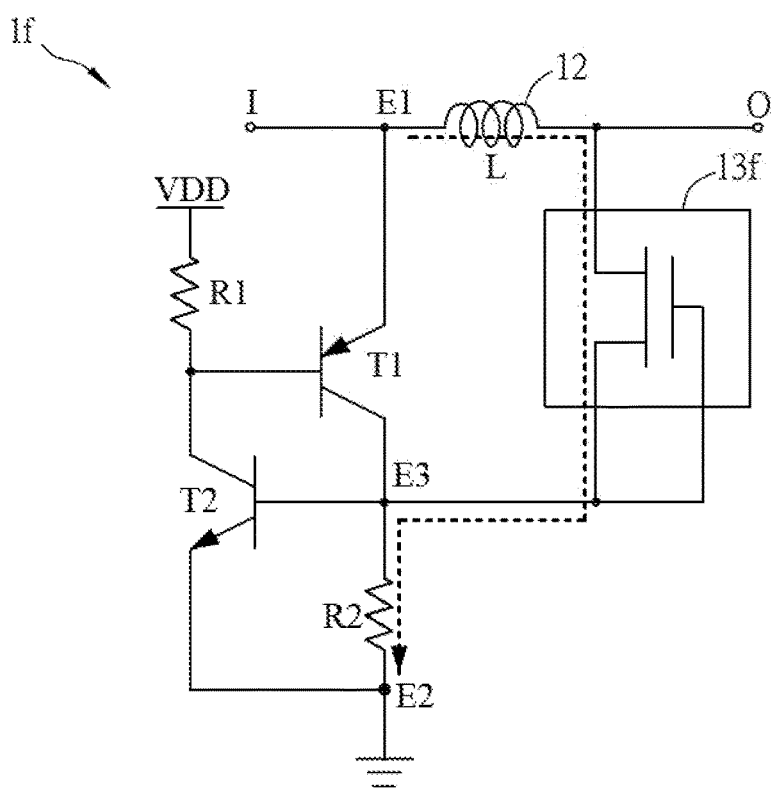

As shown in FIG. 4F, the trigger unit 13f of the ESD protection circuit if includes an NMOS transistor. When the circuit is under the normal operation status, the gate and source of the NMOS transistor are directly connected so that the cross voltage therebetween is equal to 0. Thus, the NMOS transistor is not conducted. When the electrostatic discharge occurs, the instant large voltage will crash the internal parasitic transistor (BJT) of the NMOS transistor so as to generate the current, which can trigger to conduct the silicon-controlled rectifier 11 for discharging the electrostatic current and protecting the internal circuit 21. In addition, the impedance matching of the structure can further prevent the loss of the RF signal entering the internal circuit 21.

The other technical features of the ESD protection circuits 1a~1f can be referred to the same components of the ESD protection circuit 1, so the detailed descriptions thereof will be omitted.

To sum up, in the ESD protection circuit and integrated circuit for a broadband circuit of this disclosure, the silicon-controlled rectifier is formed by four kinds of semiconductor materials, which are connected sequentially. One end of the inductor is electrically coupled with the signal input end of the ESD protection circuit and the first end of the silicon-controlled rectifier, and the other end of the inductor is electrically coupled with the signal output end of the ESD protection circuit and the high-frequency circuit. One end of the trigger unit is electrically coupled with the signal output end and the high-frequency circuit, and the other end of the trigger unit is electrically coupled with the third end of the silicon-controlled rectifier. Based on the above structural design, the ESD protection circuit and integrated circuit of this disclosure have a good ESD protection ability, are capable of improve the issue of insufficient trigger speed, and reduce the loss and reflection of the passed signals, so that the internal circuits of the integrated circuit can operate in a wider bandwidth.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An integrated circuit for a broadband circuit, comprising:
   a high-frequency circuit; and
   an ESD protection circuit comprises a signal input end and a signal output end, wherein the high-frequency circuit is electrically coupled with the signal output end, the ESD protection circuit further comprises a silicon-controlled rectifier, an inductor and a trigger unit, the silicon-controlled rectifier is formed by a first P-type semiconductor material, a first N-type semiconductor material, a second P-type semiconductor material, and a second N-type semiconductor material, which are connected sequentially, the silicon-controlled rectifier comprises a first end, a second end and a third end, the first end is electrically coupled with the first P-type semiconductor material and the signal input end, the second end is electrically coupled with the second N-type semiconductor material, the third end is electrically coupled with the second P-type semiconductor material, one end of the inductor is electrically coupled with the signal input end and the first end, the other end of the inductor is electrically coupled with the signal output end and the high-frequency circuit, one end of the trigger unit is electrically coupled with the signal output end and the high-frequency circuit and the other end of the inductor, and the other end of the trigger unit is electrically coupled with the third end of the silicon-controlled rectifier,
   wherein the ESD protection circuit has a resonance frequency, the high-frequency circuit has an operation frequency, the operation frequency includes an operation frequency range, and the resonance frequency is located within the operation frequency range,
   wherein an inductance value L of the inductor satisfies an equation as follow:

$$L = \frac{2Z_0 C}{1 + 2\pi \cdot f_0 Z_0 C^2}$$

wherein, $f_0$ is the resonance frequency, $Z_0$ is a matching impedance of the high-frequency circuit, $C_1$ is a parasitic capacitance value between the first P-type semiconductor material and the second P-type semiconductor material, $C_3$ is a parasitic capacitance value of the trigger unit, and $C=C_1=C_3$.

2. The integrated circuit according to claim 1, wherein an equivalent circuit of the silicon-controlled rectifier comprises two transistors, and one electrode of one of the transistors is electrically coupled with a voltage source.

3. The integrated circuit according to claim 1, wherein the trigger unit comprises a plurality of diodes connected in series, a plurality of Zener diodes connected in series, or a transistor.

4. An ESD protection circuit for a broadband circuit, wherein the ESD protection circuit is cooperated with a high-frequency circuit and comprises a signal input end and a signal output end, and the high-frequency circuit is electrically coupled with the signal output end, the ESD protection circuit comprising:
   a silicon-controlled rectifier formed by a first P-type semiconductor material, a first N-type semiconductor material, a second P-type semiconductor material, and a second N-type semiconductor material, which are connected sequentially, wherein the silicon-controlled rectifier comprises a first end, a second end and a third end, the first end is electrically coupled with the first P-type semiconductor material and the signal input end, the second end is electrically coupled with the second N-type semiconductor material, and the third end is electrically coupled with the second P-type semiconductor material;
   an inductor, wherein one end of the inductor is electrically coupled with the signal input end and the first end, and the other end of the inductor is electrically coupled with the signal output end and the high-frequency circuit; and
   a trigger unit, wherein one end of the trigger unit is electrically coupled with the signal output end and the high-frequency circuit, and the other end of the trigger unit is electrically coupled with the third end of the silicon-controlled rectifier,
   wherein an inductance value L of the inductor satisfies an equation as follow:

$$L = \frac{2Z_0 C}{1 + 2\pi \cdot f_0 Z_0 C^2}$$

wherein, $f_0$ is the resonance frequency, $Z_0$ is a matching impedance of the high-frequency circuit, $C_1$ is a parasitic capacitance value between the first P-type semiconductor material and the second P-type semiconductor material, $C_3$ is a parasitic capacitance value of the trigger unit, and $C=C_1=C_3$.

5. The ESD protection circuit according to claim 4, wherein the ESD protection circuit has a resonance frequency, the high-frequency circuit has an operation frequency, the operation frequency includes an operation frequency range, and the resonance frequency is located within the operation frequency range.

6. The ESD protection circuit according to claim 4, wherein an equivalent circuit of the silicon-controlled rectifier comprises two transistors, and one electrode of one of the transistors is electrically coupled with a voltage source.

7. The ESD protection circuit according to claim 4, wherein the trigger unit comprises a plurality of diodes connected in series, a plurality of Zener diodes connected in series, or a transistor.

* * * * *